United States Patent [19]
Lee

[11] Patent Number: 5,561,479
[45] Date of Patent: Oct. 1, 1996

[54] AUTOMATIC FINE TUNING CIRCUIT FOR PROCESSING AN IMAGE INTERMEDIATE FREQUENCY SIGNAL

[75] Inventor: Heung-Bae Lee, Kyungki-do, Rep. of Korea

[73] Assignee: Samsung Electronics Co., Ltd., Kyungki-do, Rep. of Korea

[21] Appl. No.: 502,159

[22] Filed: Jul. 13, 1995

[30] Foreign Application Priority Data

Jul. 13, 1994 [KR] Rep. of Korea ............... 16852/1994

[51] Int. Cl.⁶ .................................................. H04N 9/50
[52] U.S. Cl. ...................... 348/735; 348/733; 455/182.2; 455/192.2
[58] Field of Search .................... 455/192.1, 192.2, 455/192.3, 182.2, 182.9, 173.1; 348/733, 735, 731; H04N 9/50

[56] References Cited

U.S. PATENT DOCUMENTS

| | | | |
|---|---|---|---|
| 4,220,974 | 9/1980 | Craft | 358/195.1 |
| 4,283,792 | 8/1981 | Hongu et al. | 455/192 |
| 4,731,872 | 3/1988 | Washburn, Jr. | 455/210 |
| 4,843,636 | 3/1989 | Hendricks et al. | 348/735 |

*Primary Examiner*—John K. Peng
*Assistant Examiner*—Glenton B. Burgess
*Attorney, Agent, or Firm*—Sughrue, Mion, Zinn, Macpeak & Seas

[57] ABSTRACT

An automatic fine tuning (AFT) circuit used for processing an image intermediate frequency signal for a video display device. The AFT circuit, which produces an automatic fine tuning signal, by which an image intermediate frequency signal maintains a constant carrier center frequency, includes a phase shift device for performing a phase shift of 90° in the state of the constant carrier center frequency, a control current generating device for generating a control current in response to a variation of a variable resistor value, a resonant frequency variable device for varying a resonant frequency of the resonance circuit, by varying a capacitance to be resonated by the control current, and a phase detecting device for multiplying the image intermediate frequency signal by a phase-shifted image intermediate frequency signal, and for generating the automatic fine tuning signal. According to one aspect of the AFT circuit, the phase shift device includes a resonance circuit for performing the phase shift in relation to the image intermediate frequency signal.

12 Claims, 2 Drawing Sheets

AUTOMATIC FINE TUNING CIRCUIT FOR PROCESSING AN IMAGE INTERMEDIATE FREQUENCY SIGNAL

BACKGROUND OF THE INVENTION

1. Field of the Invention

The present invention relates to an image signal processing device, and more particularly, to an automatic fine tuning (hereinafter, referred to as AFT) circuit used for processing an image intermediate frequency signal for a video device.

The instant application is based on Korean Patent Application No. 16852/1994, which is incorporated herein by reference for all purposes.

2. Discussion of Related Art

An AFT circuit produces an AFT voltage, for performing the AFT operation of detecting a variation of a carrier frequency of a received image intermediate frequency signal. The AFT voltage is passed through a lowpass filter and then is fed back to a local oscillator of a tuner. The local oscillator of the tuner varies an oscillation frequency so that the image intermediate frequency signal can be kept as an exact carrier center frequency fp (45.74 MHz in a NTSC system) by the AFT voltage.

FIG. 1 is a block diagram illustrating a prior art AFT circuit. An image intermediate frequency signal Vi is received by a phase shifter 10 and a phase detector 20, respectively. The phase shift of the phase shifter 10 depends on the inputted frequency. A phase shift of 90° is performed only when the carrier frequency of the image intermediate frequency signal Vi corresponds to the carrier center frequency fp. An image intermediate frequency signal Vo, which has been phase-shifted in the phase shifter 10, is subsequently applied to the phase detector 20.

FIG. 2 is a graph illustrating the characteristic of the phase shift of phase shifter 10 corresponding to the carrier frequency of the image intermediate frequency signal Vi, received by phase shifter 10.

Phase detector 20 multiplies the image intermediate frequency signal Vi by the phase-shifted image intermediate frequency signal Vo. As a result, a voltage indicative of a phase difference between the two signals (the AFT voltage) is produced. The AFT voltage is then passed through a lowpass filter, and is subsequently fed back to the local oscillator of a tuner.

FIG. 3 is a block diagram illustrating a detailed circuit of the phase shifter 10 of FIG. 1. The received image intermediate frequency signal Vi is amplified by differential amplifiers Q1 and Q2, and then is passed through capacitors C1 and C2, thereby being received by an AFT resonance circuit 15.

The AFT resonance circuit 15 has a parallel structure, comprising a variable coil L1 connected between the capacitors C1 and C2, a capacitor C3 connected in parallel to the variable coil L1, resistors R1 and R2 respectively connected to both terminals of the capacitor C3, and a bias voltage supplying power source V1 connected to the resistors R1 and R2. Here, the AFT resonance circuit 15 is adjusted by the variable coil L1, so that when the carrier frequency of the image intermediate frequency signal Vi exactly equals a resonant frequency fp, a phase shift of 90° can be performed. Under such a circuit configuration, the phase shifter 10 has the same characteristic as that shown in FIG. 2.

In the AFT circuit as shown in FIG. 1, the carrier frequency of the received image intermediate frequency signal Vi is very high. For this reason, it is preferable that a tuning circuit used in the AFT circuit should have excellent selectivity and stability.

A phase shifter 10 using the AFT resonance circuit 15, comprising the variable coil L1, the capacitor C3, and the resistors R1 and R2, allows for exact detection of the carrier center frequency of the image intermediate frequency signal Vi. However, even though the prior art AFT circuit operates well alone, the recent trend pursuing system integration has created problems that are described below.

One problem associated with system integration is that often the distance between the a voltage controlled oscillator (VCO) resonance circuit (which detects a phase locked loop (PLL)image for processing an image intermediate frequency signal) and the AFT resonance circuit is very short. As a result, a mutual interference can be generated between the VCO coil of the VCO resonance circuit and the AFT coil of the AFT resonance circuit. Furthermore, a signal level in the AFT coil of the AFT resonance circuit can induce a corresponding signal in the VCO coil for detecting the image, thereby generating a mis-oscillation of the VCO. Due to the mutual interference as described above, a quadrature phase shifter 10, as shown in FIG. 1, cannot phase shift the image intermediate frequency signal Vi by 90° when it corresponds to the carrier center frequency fp.

SUMMARY OF THE INVENTION

It is therefore an object of the present invention to provide an AFT circuit which can keep the resonance level of a resonance circuit low in a system for processing an image intermediate frequency signal, thereby decreasing interference of other circuits by means of an AFT resonance circuit.

It is another object of the present invention to provide an AFT circuit which can exactly adjust the carrier center frequency of a resonance circuit of an AFT circuit.

To accomplish these and other objects, an AFT circuit with a low resonance level is required to decrease the interference to a voltage controlled oscillator VCO circuit. The present invention teaches an AFT circuit which adjusts the resonance level of an AFT resonance circuit in the phase shifter using a capacitance component of the AFT resonance circuit, instead of adjusting the resonance level by a variable coil, as in the conventional resonance circuit.

A more complete appreciation of the invention, and many of the attendant advantages thereof, will be readily apparent as the same becomes better understood by reference to the following detailed description when considered in conjunction with the accompanying drawings, where like reference symbols indicate the same or similar components.

BRIEF DESCRIPTION OF THE DRAWINGS

The preferred embodiments are described with reference to the drawings in which.

DETAILED DESCRIPTION OF THE PREFERRED EMBODIMENT

Figure 4:
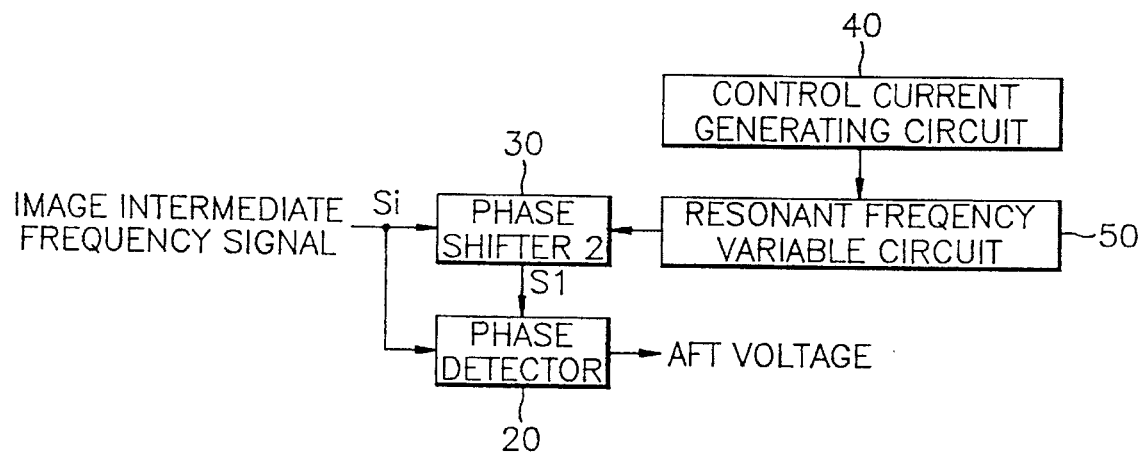
FIG. 4 is a block diagram illustrating an automatic fine tuning circuit according to the present invention.

FIG. 4 is a block diagram illustrating an automatic fine tuning (AFT) circuit according to the present invention. A control current generating circuit 40 and a resonant frequency variable circuit 50 allow for maintaining the resonance level in an AFT resonance circuit (element 35 of FIG. 5) at a low level, so that the resonance level of phase shift to an image intermediate frequency signal can be easily adjusted.

Figure 1:
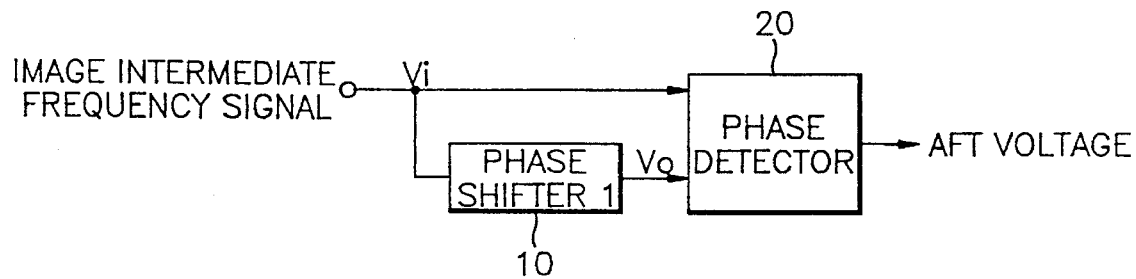
FIG. 1 is a block diagram illustrating a prior art automatic fine tuning circuit.
Figure 2:
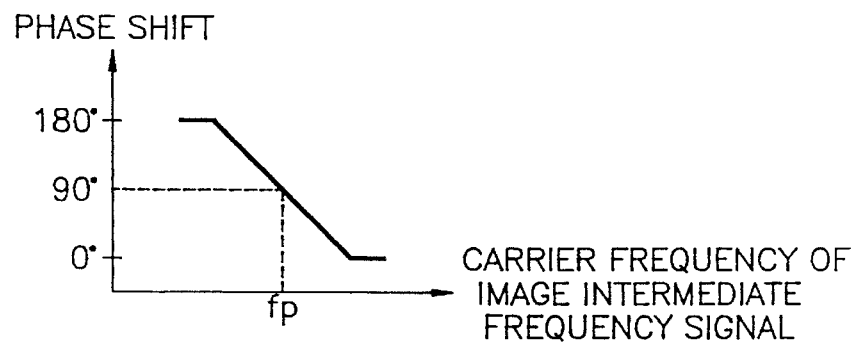
FIG. 2 is a graph illustrating the characteristic of phase shifter 10 of FIG. 1.
Figure 3:
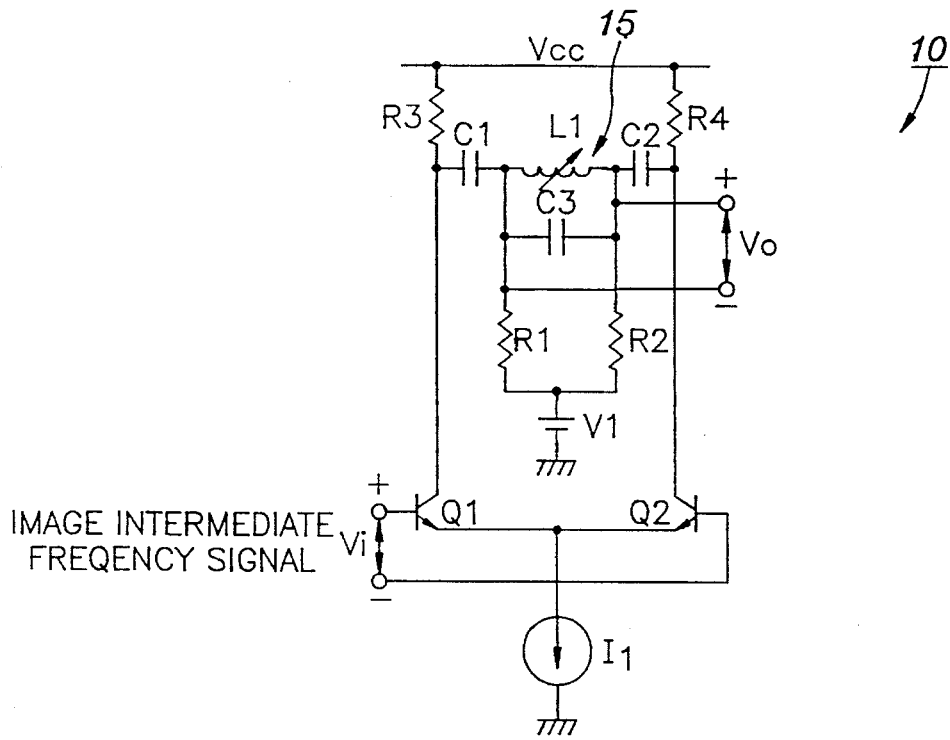
FIG. 3 is a circuit illustrating the phase shifter 10 of FIG. 1.

The phase shifter 30 of FIG. 4 operates in the same manner as the phase shifter 10 of FIG. 1. Therefore, the phase shifter 30 has the same characteristic as shown in FIG. 2 for phase shifter 10. Around the carrier center frequency fp, the characteristic resembles a reverse s-curve, in accordance with an image intermediate frequency signal that is phase shifted by 90° at the carrier center frequency fp.

Figure 5:
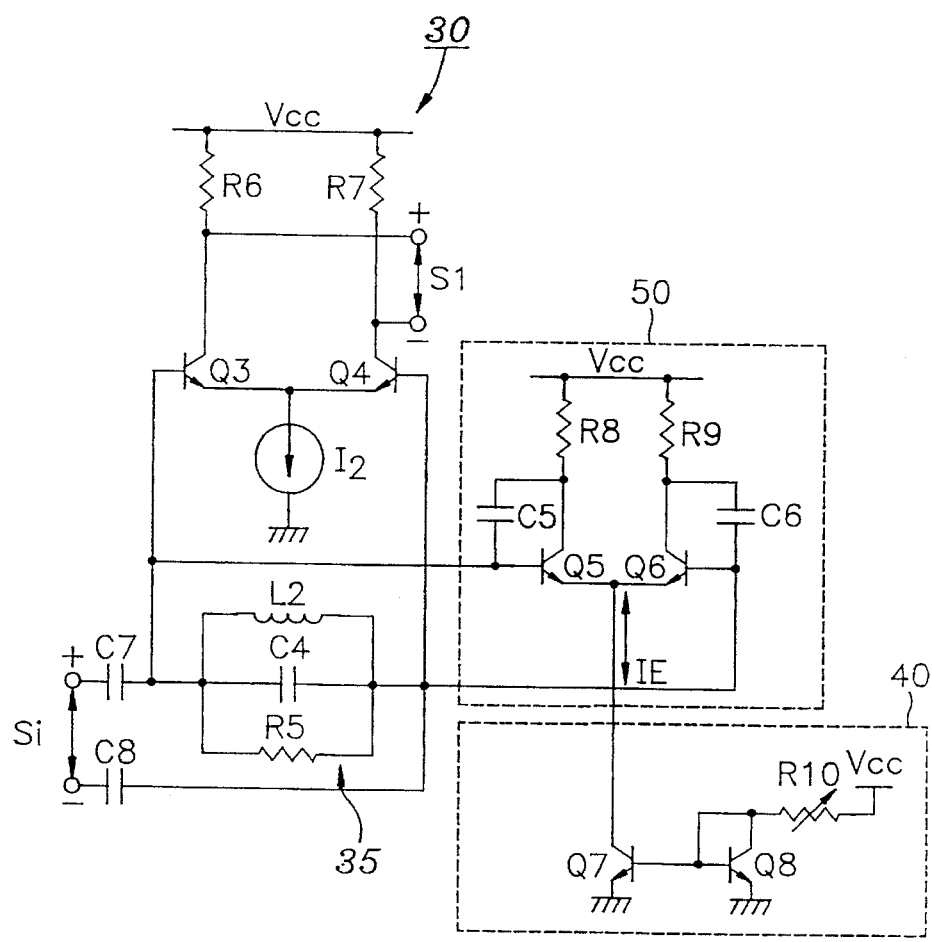
FIG. 5 is a circuit illustrating one embodiment according to the present invention.

Referring to FIG. 5, the control current generating circuit 40 produces a current $I_E$, which is varied by a variable resistor R10. This allows for variance of a capacitance component of the AFT resonance circuit 35 of the phase shifter 30.

In accordance with the amount of the current $I_E$ received from the control current generating circuit 40, the resonant frequency variable circuit 50 changes the current applied to the AFT resonance circuit 35 of phase shifter 30, thereby varying the capacitance component of the AFT resonance circuit 35. In this manner, the resonant frequency of the phase shifter 30 is varied.

Referring to FIG. 4, a phase detector 20 multiplies the image intermediate frequency signal Si by a phase shifted image intermediate frequency signal S1. A voltage corresponding to a phase difference between these two signals is thereby produced.

Referring to FIG. 5, the AFT resonance circuit 35 of the phase shifter 30, as a parallel resonance circuit, is constructed as follows. The image intermediate frequency signal Si, received at the AFT circuit, is connected to each of capacitors C7 and C8. These capacitors, connected to an inductor L2, a capacitor C4, and a resistor R5, mutually connected in parallel, are resonated by the input signal. Phase shifter 30 differs from phase shifter 10 in that the AFT resonance circuit 35 is connected to bases of differential amplifiers Q3 and Q4.

The control current generating circuit 40 is in the configuration of a current mirror circuit, where bases of transistors Q7 and Q8 are connected to each other, with their emitters connected to ground. The collector of the transistor Q8 is connected to variable resistor R10, to which power supply voltage Vcc is applied. The collector of the transistor Q7 is connected to resonant frequency variable circuit 50.

The resonant frequency variable circuit 50 is comprised of differential amplifiers (transistors Q5 and Q6), resistors R8 and R9, and capacitors C5 and C6. Preferably, emitters of the transistors Q5 and Q6 are connected with the control current generating circuit 40 at a common node. Capacitors C5 and C6 are respectively connected in parallel between the bases and collectors of the transistors Q5 and Q6. The capacitors C5 and C6 are also respectively connected to both terminals of AFT resonance circuit 35 of phase shifter 30.

A discussion of the operation of the AFT circuit in FIG. 5 follows. The variable resistor R10, of the control current generating circuit 40, is varied so that the image intermediate frequency signal Si has the carrier center frequency fp. In this way, the value of emitter current $I_E$ is varied. The emitter current $I_E$ flows to a ground terminal of transistor Q7 of the control current generating circuit 40 from the emitters of the transistors Q5 and Q6 in the resonant frequency variable circuit 50. Variance of emitter current $I_E$ causes the value of a parasitic capacitance between the bases and collectors of transistors Q5 and Q6, in the resonant frequency variable circuit 50, to vary.

Furthermore, the capacitances between opposing terminals of each of the capacitors C5 and C6 also vary as a result. Since the capacitors C5 and C6 are connected in parallel to the resonance circuit 35, the capacitance component of the resonance circuit 35 is varied according to the capacitance variation of the capacitors C5 and C6.

Thus, the image intermediate frequency signal Si received at the resonance circuit 35 of the phase shifter 30 (via the capacitors C7 and C8) takes on the same characteristic as shown in FIG. 2, which corresponds to a phase shift of 90° where the carrier frequency of the image intermediate frequency signal is the carrier center frequency fp. The signal is then amplified by the differential amplifiers Q3 and Q4, thereby being transmitted to the phase detector 20 of FIG. 4.

The prior art AFT circuit has a difficulty in varying a variable coil of a resonance circuit and then adjusting a center frequency of an image intermediate frequency signal. To overcome this difficulty, the AFT circuit according to the present invention varies the capacitance component of the resonance circuit under the control of the variable resistor, thereby easily adjusting the center frequency of the image intermediate frequency signal.

As mentioned previously, the AFT resonance circuit, constructed according to the present invention, has a lower resonance level. As a result, the AFT circuit decreases interference to the VCO resonance circuit.

Also, there is the additional advantage in that the AFT circuit adjusts the capacitance component of the AFT resonance circuit rather than the variable coil of the conventional resonance circuit, so that an exact phase shift of 90° can be executed when the carrier frequency of the image intermediate frequency signal is the carrier center frequency fp.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. An automatic fine tuning circuit producing an automatic fine tuning signal, by which an image intermediate frequency signal is maintained at a constant carrier center frequency, said circuit comprising:

phase shift means for performing a phase shift of 90° while said image intermediate frequency is maintained at a constant carrier center frequency, thereby generating a phase shifted intermediate frequency signal, said phase shift means including a resonance circuit for performing a phase shift corresponding to said image intermediate frequency signal;

control current generating means for generating a control current in response to a variation in value of a variable resistor;

resonant frequency variable means for varying a resonant frequency of said resonance circuit by varying a capacitance responsive to said control current; and phase detecting means for multiplying said image intermediate frequency signal by said phase-shifted image intermediate frequency, thereby generating said automatic fine tuning signal.

2. The automatic fine tuning circuit according to claim 1, wherein said resonance circuit is connected between bases of differential amplifiers so as to decrease a resonance level of said resonance circuit.

3. The automatic fine tuning circuit according to claim 1, wherein said control current generating means comprises a current mirror circuit, said current mirror circuit generating said control current by adjusting said variable resistor.

4. The automatic fine tuning circuit according to claim 1, wherein said resonance circuit has a parallel structure for adjusting said resonant frequency by varying a capacitance therein.

5. The automatic fine tuning circuit according to claim 1, wherein said resonant frequency variable means comprises:
   means for differential amplifying said control current; and
   capacitor means, connected in parallel between said differential amplifying means and said resonance circuit, for adjusting said capacitance resonated by said control current supplied therein by an operation of said differential amplifying means.

6. An automatic fine tuning circuit producing an automatic fine tuning signal, by which an image intermediate frequency signal is maintained at a constant carrier center frequency, said circuit comprising:
   phase shift means for performing a phase shift of 90° while said image intermediate frequency is maintained at a constant carrier center frequency, thereby generating a phase shifted intermediate frequency signal;
   control current generating means for generating a control current in response to a variation in value of a variable resistor;
   resonant frequency variable means for varying a resonant frequency of said phase shift means by varying a capacitance responsive to said control current; and
   phase detecting means for multiplying said image intermediate frequency signal by said phase-shifted image intermediate frequency, thereby generating said automatic fine tuning signal.

7. The automatic fine tuning circuit according to claim 6, wherein said phase shift means further comprises a resonance circuit for performing a phase shift corresponding to said image intermediate frequency signal.

8. The automatic fine tuning circuit according to claim 7, wherein said resonance circuit is serially disposed between a pair of capacitors located at voltage terminals receiving said image intermediate frequency signal.

9. The automatic fine tuning circuit according to claim 7, wherein said resonant frequency variable means includes differential amplifiers whose respective bases are connected to respective ends of said resonance circuit so as to control a resonance level of said resonance circuit.

10. The automatic fine tuning circuit according to claim 6, wherein said control current generating means comprises a current mirror circuit, said current mirror circuit generating said control current by adjusting said variable resistor.

11. The automatic fine tuning circuit according to claim 7, wherein said resonance circuit includes an inductor, a capacitor and a resistor, all of which are connected in parallel and wherein said resonant frequency is adjusted by varying effective capacitance of said resonance circuit.

12. The automatic fine tuning circuit according to claim 6, wherein said resonant frequency variable means comprises:
   means for differential amplifying said control current; and
   capacitor means, connected in parallel between said differential amplifying means and said resonance circuit, for adjusting said capacitance resonated by said control current supplied therein by an operation of said differential amplifying means.

\* \* \* \* \*